United States Patent
Paz de Araujo et al.

(10) Patent No.: US 10,580,981 B1
(45) Date of Patent: Mar. 3, 2020

(54) METHOD FOR MANUFACTURE OF A CEM DEVICE

(71) Applicant: Arm Limited, Cambridge (GB)

(72) Inventors: Carlos Alberto Paz de Araujo, Colorado Springs, CO (US); Jolanta Bozena Celinska, Colorado Springs, CO (US); Lucian Shifren, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/057,515

(22) Filed: Aug. 7, 2018

(51) Int. Cl.
*H01L 45/00* (2006.01)
*C23C 16/40* (2006.01)
(Continued)

(52) U.S. Cl.
CPC ........ *H01L 45/1616* (2013.01); *C23C 16/305* (2013.01); *C23C 16/40* (2013.01);
(Continued)

(58) Field of Classification Search
CPC ............. H01L 45/1616; H01L 45/1233; H01L 45/145; H01L 45/1641; C23C 16/305; C23C 16/40; C23C 16/45527
See application file for complete search history.

(56) References Cited

U.S. PATENT DOCUMENTS 7,298,640 B2 11/2007 Chen et al.
7,639,523 B2 12/2009 Celinska et al.
(Continued)

FOREIGN PATENT DOCUMENTS

WO WO 2018/056237 * 8/2019 ............... H91C 7/04

OTHER PUBLICATIONS

Averitt et al., "Ultrafast optical and far-infrared quasiparticle dynamics in correlated electron materials", 20012, J. Phys.: Condens. Matter 14 (2002) pp. R1357-R1390, published on Dec. 6, 2002 (Year: 2002).*

(Continued)

*Primary Examiner* — Nikolay K Yushin
(74) *Attorney, Agent, or Firm* — Berkeley Law & Technology Group, LLP

(57) ABSTRACT

A method for the manufacture of a correlated electron material device which method comprises forming a conductive substrate and forming a layer of a correlated electron material on the conductive substrate,
wherein the forming of the correlated electron material layer comprises:
forming a layer of a metal rich transition or other metal compound; and
annealing the layer of the metal rich transition or other metal compound in an atmosphere containing a gaseous precursor for an electron-back donating extrinsic ligand capable of occupying an anion vacancy within the transition or other metal compound;
wherein the annealing provides that an anion vacancy within the transition or other metal compound is occupied by an electron back-donating extrinsic ligand; and
wherein the annealing is carried out at a predetermined temperature and for a predetermined time whereby to activate electron back-donation from a transition or other metal cation to the electron back-donating extrinsic ligand occupying the anion vacancy.

17 Claims, 7 Drawing Sheets

(51) Int. Cl.
*C23C 16/455* (2006.01)
*C23C 16/30* (2006.01)

(52) U.S. Cl.
CPC .... *C23C 16/45527* (2013.01); *H01L 45/1233* (2013.01); *H01L 45/145* (2013.01); *H01L 45/1641* (2013.01)

(56) References Cited

U.S. PATENT DOCUMENTS

| | | | |
|---|---|---|---|
| 7,778,063 | B2 | 8/2010 | Brubaker et al. |
| 7,872,900 | B2 | 1/2011 | Paz De Araujo et al. |
| 9,627,615 | B1 | 4/2017 | Reid et al. |
| 9,722,179 | B2 * | 8/2017 | Paz de Araujo .... H01L 45/1608 |
| 9,997,702 | B2 | 6/2018 | Reid et al. |
| 2008/0106927 | A1 | 5/2008 | Celinska et al. |
| 2013/0119396 | A1 | 5/2013 | Yu et al. |
| 2013/0285699 | A1 | 10/2013 | McWilliams et al. |
| 2016/0163978 | A1 | 6/2016 | Paz De Araujo et al. |
| 2017/0213960 | A1 | 7/2017 | Paz De Araujo et al. |
| 2017/0237001 | A1 | 8/2017 | Reid et al. |
| 2017/0244032 | A1 | 8/2017 | Reid et al. |
| 2017/0301859 | A1 | 10/2017 | Paz De Araujo et al. |
| 2018/0013062 | A1 | 1/2018 | Reid et al. |
| 2018/0019394 | A1 | 1/2018 | Reid et al. |
| 2018/0053892 | A1 | 2/2018 | Reid et al. |
| 2018/0096713 | A1 | 4/2018 | Chandra et al. |
| 2018/0107801 | A1 | 4/2018 | Guo et al. |
| 2018/0159028 | A1 | 6/2018 | Shifren et al. |
| 2018/0159029 | A1 | 6/2018 | Paz De Araujo et al. |
| 2018/0159031 | A1 | 6/2018 | Paz De Araujo et al. |
| 2018/0175290 | A1 | 6/2018 | Reid et al. |

OTHER PUBLICATIONS

Fadley, "X-ray photoelectron spectroscopy: Progress and perspectives", 2010, Journal of Electron Spectroscopy and Related Phenomena 178-179 (2010) pp. 2-32, published on Feb. 4, 2010 (Year: 2010).*

Notification of Transmittal of the International Search Report and the Written Opinion of the International Searching Authority, or the Declaration, App. No. PCT/GB2019/052144, Dated Dec. 17, 2019, 1 Page.

International Search Report, App. No. PCT/GB2019/052144, Dated Dec. 17, 2019, 7 Pages.

Written Opinion of the International Searching Authority, App. No. PCT/GB2019/052144, Dated Dec. 17, 2019, 12 Pages.

* cited by examiner

METHOD FOR MANUFACTURE OF A CEM DEVICE

The present disclosure is concerned with a method for the manufacture a correlated electron material (CEM) device as well as with a CEM device obtained by the method.

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

There appears to be an ever-increasing drive towards memory and/or logic devices which can exhibit lower power and/or higher speed. Switching devices comprising a correlated electron material are at the forefront of this drive not just because they can exhibit low power and/or high speed but also because they are generally reliable and easily and cheaply manufactured.

The present disclosure describes an improved CEM device and methods for its manufacture. The CEM device may, in particular, be a switching device. The CEM switching device may find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition.

As used herein, references to a Mott transition are references to traditional Mott transitions (which are described in the literature as purely coulombic) as well as references to Mott-like transitions (in which the coulombic interaction is modified by some other electron interaction, such as a dipole-core charge interaction). Accordingly, a reference to a Mott insulator includes a reference to a charge-transfer (Mott) insulator, such as nickel (II) oxide, in which the columbic interaction or screening is modified by a charge transfer complex through hybridisation with the oxygen band.

In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1B, a CEM switching device may comprise a layer of correlated electron material (a CEM layer) sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 102).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ applied during a write operation at point 116 to place the CEM switching device into a relatively low-impedance state, may determine a compliance condition for placing the CEM device into a high-impedance state in a subsequent write operation. As shown in FIG. 1A, the CEM device may be subsequently placed into a high-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \tag{1}$$
$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \tag{2}$$
$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $U_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

FIG. 1B shows a CEM switching device comprising a CEM layer sandwiched between a conductive substrate and a conductive overlay and FIG. 1C shows a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals. The equivalent circuit for a variable impedance device may comprise a variable resistor, such as variable resistor, in parallel with a variable capacitor. Of course, although a variable resistor and variable capacitor are depicted in FIG. 1C as comprising discrete components, the variable impedance device, such as that shown, may comprise a substantially homogenous CEM.

TABLE 1

Correlated Electron Switch Truth Table

| Resistance | Capacitance | Impedance |
|---|---|---|
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

Table 1 illustrates an example truth table for an example variable impedance device, such as the device of FIG. 1A. Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high impedance state, for example, via injection of a sufficient quantity of electrons to satisfy a Mott transition criterion. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

In particular embodiments, changes in impedance states of CEM devices, such as a change between a low-impedance state and a substantially dissimilar, high-impedance state, may be brought about by "electron back-donation" within the correlated electron material.

An electron back-donation may permit a transition or other metal within a correlated electron material to maintain an ionization state that is favorable to electrical conduction under an influence of an applied voltage.

The electron back-donation may occur within a correlated electron material responsive to use of a dopant providing an electron back-donating extrinsic ligand for a transition or other metal of the correlated electron material.

Note that the extrinsic ligand may be understood to be an "electron back-donating ligand" in the sense that it can accept electrons from the transition or other metal when it donates electrons to the transition or other metal.

The electron back-donating extrinsic ligand may, in particular, permit a correlated electron material to exhibit a property in which electrons are controllably, and reversibly, "donated" to a conduction band of the correlated electron material during operation of a device or circuit comprising the correlated electron material.

This back-donation may be reversed thereby permitting the correlated electron material to switch to exhibiting a substantially dissimilar impedance property, such as a high-impedance property, during device operation.

An electron back-donating material may be understood to refer to a correlated electron material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the correlated electron material.

In some embodiments, by way of back-donation, a correlated electron material switch comprising a transition metal, transition metal compound, or a transition metal oxide, may exhibit low-impedance properties if the transition metal, such as nickel, is placed into an oxidation state of 2+ (e.g., $Ni^{2+}$ in a material, such as NiO:CO). Conversely, electron back-donation may be reversed if a transition metal, such as nickel, is placed into an oxidation state of 1+ or 3+ (e.g. $Ni^+$ or $Ni^{3+}$ in a material, such as NiO:CO).

Accordingly, during operation of a correlated electron material device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni^{1+}+Ni^{3+}$ as shown in expression (4), which may bring about, for example, a relatively high-impedance state during operation of the CEM device. In an embodiment, a dopant such as a carbon-containing ligand, such as carbonyl (CO) or a nitrogen-containing ligand, such as nitrosyl (NO), may permit sharing of electrons during operation of a correlated electron material device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance state.

In particular embodiments, the correlated electron material may be one which is "born on" to the device. In other words, the correlated electron material of the first formed device is an electron back-donating material which has a first impedance state which is a relatively low impedance (relatively conducting) state.

It has now surprisingly been found that forming a correlated electron material layer containing an electron back-donating extrinsic ligand does not necessarily result in an electron back-donating material and, in particular, a correlated electron material layer which is "born on".

Although the correlated electron material layer may contain an electron back-donating extrinsic ligand, the electron back-donation from the metal to the ligand may be partial or even non-existent because the forming conditions are not sufficient to "activate" the electron back-donation.

Accordingly, the extent of electron back-donation within a correlated electron material layer may be controlled—and controlled to a degree providing for differences in the performance qualities (such as $V_{reset}$) of the correlated electron material device.

Note, however, the control over the performance qualities of the device may also depend on other factors, and in particular, on the amount of doping by the electron back-donating extrinsic ligand in the correlated electron material layer.

Accordingly, the present disclosure provides a method for the manufacture of a correlated electron material device which method comprises forming a conductive substrate and forming a layer of a correlated electron material on the conductive substrate, wherein the forming of the correlated electron material layer comprises:

forming a layer of a metal rich transition or other metal compound; and annealing the layer of the metal rich transition or other metal compound in an atmosphere containing a gaseous precursor for an electron-back donating extrinsic ligand capable of occupying an anion vacancy within the transition or other metal compound;

wherein the annealing provides that an anion vacancy within the transition or other metal compound is occupied by the electron back-donating extrinsic ligand; and wherein the annealing is carried out at a predetermined temperature and for a predetermined time whereby to activate electron back-donation from a transition or other metal cation to the electron back-donating extrinsic ligand occupying the anion vacancy.

A "transition or other metal compound" may be understood to refer to a chemical compound of a transition metal, or any other metal, with another element or elements (such as oxygen, sulphur, selenium, tellurium etc).

The chemical compound may be best described as one which has a crystal structure comprising ionic bonding between metal cation and an anion (although the nature of the bonding may not be strictly ionic).

A "metal rich" transition or other metal compound may be understood to refer to a transition or other metal compound which comprises anion vacancies in its lattice structure and/or a population of metal atoms located at or in the interstices of the lattice structure.

An "extrinsic ligand" (or dopant) may be understood to refer to a ligand which does not generally form part of the lattice structure of metal cation and anion of the transition or other metal compound.

An "anion vacancy" may be understood to refer to a vacancy in the lattice structure of metal cation and anion of the transition or other metal compound. The anion vacancy may also be understood as being within a co-ordination sphere of the metal ion of the transition or other metal compound.

The forming of the layer of a metal rich transition or other metal compound may comprise directly forming a layer of a metal rich non-stoichiometric transition or other metal compound.

Alternatively, the forming of the layer of metal rich transition or other metal compound may comprise forming a layer of a stoichiometric transition or other metal compound and treating it (for example, by heating to high temperature) so that it forms a layer of a metal rich non-stoichiometric transition or other metal compound.

In embodiments, the metal rich transition or other metal compound is a non-stoichiometric metal oxide having general formula $M_xO_{1-x}$ or $M_{1+x}O_2$ wherein M is alkaline earth metal, a lanthanide, a transition metal or a post-transition metal. In these embodiments, the anion is oxygen anion ($O^{2-}$) and the anion vacancies are oxygen anion ($O^{2-}$) vacancies.

In other embodiments, the metal rich transition or other metal compound is a non-stoichiometric metal chalcogenide having general formula $M_xE_{1-x}$ or $M_{1+x}E_2$ and wherein M wherein M is alkaline earth metal, a lanthanide, a transition metal or a post-transition metal and E is one or more of sulphur (S), selenium (Se), tellurium (Te) and polonium (Po). In these embodiments, the anion is chalcogenide anion (for example, $S^{2-}$, $Se^{2-}$ or $Te^{2-}$) and the anion vacancies are chalcogenide anion (for example, $S^{2-}$, $Se^{2-}$ or $Te^{2-}$) vacancies.

Note, however, that the metal rich transition or other metal compound may comprise a non-stoichiometric metal oxide or chalcogenide wherein the metal has a nominal oxidation state greater than or equal to +3.

The alkaline earth metal may be chosen from the group consisting of magnesium, calcium, strontium or barium and mixtures thereof. The lanthanides may be chosen from the group consisting of lanthanum, cerium, praseodymium, neodymium, promethium, samarium, europium, gadolinium, terbium, dysprosium, erbium or ytterbium and mixtures thereof.

The transition metal may be chosen from the group of metals consisting of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold and mercury or mixtures thereof.

In particular embodiments, the transition metal is chosen from the group of metals consisting of vanadium, chromium, manganese, iron, cobalt, nickel, niobium, molybdenum, technetium, ruthenium, rhodium, palladium, hafnium, tantalum, tungsten, rhenium, osmium, iridium and platinum and mixtures thereof. These transition metals are more electronegative than other transition metals and consequently can back-donate more electrons to the extrinsic ligand.

The post transition metal may be chosen from the group of metals consisting of aluminum, gallium, indium, thallium, tin, lead, and bismuth and mixtures thereof.

In one embodiment, the metal rich transition or other metal compound is a nickel (II) oxide (NiO) or hafnium (IV) oxide ($HfO_2$). In another embodiment, the metal rich transition metal or other compound is a nickel (II) sulfide selenide (NiSSe). In a further embodiment, the metal rich transition metal or other compound is a bismuth (III) telluride ($Bi_2Te_3$).

The forming of the correlated electron material layer may comprise annealing a layer of a metal rich transition or other metal compound which does not already contain an amount of the electron back-donating extrinsic ligand.

In some embodiments, therefore, the forming of the layer of a metal rich transition or other metal oxide may comprise reactive sputtering of a transition or other metal with a non-stoichiometric amount of a gaseous oxidant, such as oxygen.

In other embodiments, the forming of the layer of a metal rich transition or other metal oxide may comprises sputtering the transition or other metal oxide and heating the transition or other metal oxide so that it forms a metal rich transition or other metal oxide.

The forming of the correlated electron material layer may comprise annealing a layer of a metal rich transition or other metal compound which already contains an amount of the electron back-donating extrinsic ligand.

In some embodiments, therefore, the reactive sputtering may be carried out in the presence of a gaseous precursor for an electron-back donating extrinsic ligand.

In other embodiments, the forming of the layer of a metal rich transition metal or other compound may comprise an atomic layer deposition (ALD) of a transition or other metal oxide from an organometallic precursor and a non-stoichiometric amount of a gaseous oxidant, such as oxygen.

In these embodiments, the atomic layer deposition may (but need not) provide a layer of a metal rich transition or other metal oxide including an amount of an electron back-donating extrinsic ligand (such as carbonyl).

The atomic layer deposition may form the layer of transition metal or other compound utilising separate precursor molecules AX and BY, according to the expression (6) below:

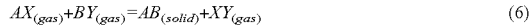

$$AX_{(gas)} + BY_{(gas)} = AB_{(solid)} + XY_{(gas)} \quad (6)$$

wherein "A" of expression (6) corresponds to the transition metal, and "AB" a transition metal compound, such as a transition metal oxide.

In these embodiments, "X" of expression (6) may comprise one or more of a ligand, such as an organic ligand, for example, amidinate (AMD), cyclopentadienyl (Cp), di(ethylcylcopentadienyl) ((EtCp)$_2$), bis(2,2,6,6-tetramethylheptane-3,5-dionato) ((thd)$_2$), acetylacetonate (acac), bis(methylcyclopentadienyl) ((MeCp)$_2$), dimethylglyoximate (dmg)$_2$, (apo)$_2$ where apo=2-amino-pent-2-ene-4-onato, (dmamb)$_2$ where dmamb=1-dimethylamino-2-methyl-2-butanolate, (dmamp)$_2$ where dmamp=1-dimethylamino-2-methyl-2-propanolate and bis(pentamethylcyclo-pentadienyl) (C$_5$(CH$_3$)$_5$)$_2$.

Suitable precursor molecules AX include, therefore, organometallic compounds of the transition metals having one or more of these ligands alone or in combination together with other ligands.

Accordingly, in some embodiments, a nickel based precursor AX (NiX) may comprise, for example, nickel amidinate (Ni(AMD)), bis(cyclopentadienyl)nickel (Ni(Cp)$_2$), nickel acetoacetonate (Ni(acac)$_2$), nickel dimethylglyoximate (Ni(dmg)$_2$), bis(ethylcyclo-pentadienyl)nickel(Ni (EtCp)$_2$), bis(methylcyclopentadienyl)nickel (Ni (CH$_3$C$_5$H$_4$)$_2$), nickel 2-amino-pent-2-en-4-anate (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate or bis(pentamethyl-cyclopentadienyl)nickel (Ni(C$_5$(CH$_3$)$_5$)$_2$).

The precursor "BY" in expression (6) may comprise a gaseous oxidant, such as water (H$_2$O), oxygen (O$_2$), ozone (O$_3$), nitric oxide (NO), nitrous oxide (N$_2$O) hydrogen peroxide (H$_2$O$_2$) or plasma-formed oxygen radical (O•).

In embodiments, the atomic layer deposition may employ an organometallic precursor and a gaseous oxidant, such as oxygen, wherein the process conditions controlled (by for example, a mass flow controller) so that the layer of transition or other metal oxide is formed with oxygen anion (O$^{2-}$) vacancies in the lattice structure of the transition or other metal oxide.

In these embodiments, the partial pressure of the oxidant may generally be less than that necessary for formation of a stoichiometric transition or other metal oxide—and may result in the presence of metal atoms in the interstices of the lattice structure.

Note that interstitial metal atoms may be incorporated into the lattice structure of the transition or other metal oxide during the annealing.

Note further, that the atomic layer deposition may provide that the aforementioned ligand "X" is oxidised or substituted so that the layer of a metal rich transition or other metal oxide includes an amount of an electron back-donating extrinsic ligand (such as carbonyl).

However, the atomic layer deposition may use a transition or other metal carbonyl as a reactant precursor. Suitable transition metal carbonyls include, for example, nickel tetracarbonyl (Ni(CO)$_4$), iron pentacarbonyl (Fe(CO)$_5$), dicobalt octacarbonyl (Co$_2$(CO)$_8$), triruthenium dodecacarbonyl (Ru$_3$(CO)$_{12}$), tetrarhodium dodecacarbonyl (Rh$_4$(CO)$_{12}$), triosmium dodecacarbonyl (Os$_3$CO$_{12}$), tetrairidium dodecacarbonyl (Ir$_4$(CO)$_{12}$).

In that case, the annealing may introduce a further amount of the electron back-donating extrinsic ligand and/or re-distribute the electron back-donating extrinsic ligand to occupy metal counter-ion vacancies in the lattice structure of the transition or other metal compound.

Note, that the forming of the layer of metal rich transition or other metal compound may employ any suitable chemical vapour deposition, or physical vapour deposition as well as spin deposition. The chemical vapour deposition or physical vapour deposition may be enhanced by, for example, later treatment or rapid thermal cycling.

The method may comprise forming a layer of a metal rich transition or other metal oxide wherein the transition or other metal oxide is intrinsically "p-type".

A "p-type" transition or other metal oxide is one in which the Fermi Energy level is near to and above the lower Hubbard band (or the highest occupied molecular orbital) in the transition or other metal oxide.

In a p-type transition or other metal oxide, the activation of electron back-donation from the metal cation to the electron back-donating extrinsic ligand may push the Fermi Energy level down into the lower Hubbard band (or the highest molecular orbital) and lead to a correlated electron material which is born on and has a higher electrical conductivity when operated in a relatively low impedance state.

In particular embodiments, therefore, an increased proportion of extrinsic ligands which provide for electron back-donation may ensure that the correlated electron material is born on and may enable increased electrical conductivity of the correlated electron material.

Accordingly, the method provides an ability to tailor or customise the electrical conductivity of a correlated electron material operated in a relatively low impedance state by controlling the extent of electron back-donation in the correlated electron material layer.

In particular embodiments, changes in the proportion of electron back-donating extrinsic ligands that are engaged by electron back-donation in a correlated electron material device may be observed in the characteristics of region 104 of FIG. 1A.

An increase in the proportion of electron back-donating extrinsic ligands that are engaged by electron back-donation brings about a steeper (e.g. more positive) slope of the region 104 to indicate higher conductivity.

The electron back-donation available to a correlated electron material may be controlled not only by the activation of the electron-back-donating extrinsic ligand but also by the number of anion vacancies in the layer of the metal rich transition or other metal compound when it is first formed.

Of course, the number of anion vacancies which are occupied by the electron back-donating ligand when it is or has been annealed may also serve to control the electron back-donation within the correlated electron material.

The electron back-donating extrinsic ligand may, in particular, be chosen from the group of ligands consisting of the π-acceptors of the spectrochemical series of ligands.

In particular embodiments, the electron back-donating extrinsic ligand is carbonyl (CO), nitrosyl (NO), an isocyanide (RNC where R is H, $C_1$-$C_6$ alkyl or $C_6$-$C_{10}$-aryl), an alkene (e.g. ethene), an alkyne (e.g. ethyne) or a phosphine such as a trialkyl phosphine or a triaryl phosphine ($R_3P$ wherein R is H, $C_1$-$C_6$-alkyl or $C_6$-$C_{10}$-aryl), for example, triethyl phosphine ($PEt_3$).

The gaseous precursors for at least some of these ligands include carbon monoxide (CO), nitric oxide (NO), ethene, ethyne or isocyanides, for example ethyl isocyanide and phosphines, for example, triethyl phosphine.

The method may further comprise forming a conductive overlay on or over the correlated electron material layer. The conductive overlay may be formed prior to annealing or following the annealing.

The method may further comprise etching the correlated electron material layer and the layer of conductive substrate following the annealing. Alternatively, the method may further comprise etching the conductive overlay, the correlated electron material and the conductive substrate.

The predetermined temperature and the predetermined time of the annealing may vary depending on whether the correlated electron material layer is etched and/or the presence of the conductive overlay.

In embodiments, the predetermined temperature for the annealing is higher than the temperature employed for forming the layer of the metal rich transition or other metal layer.

Note, however, that the method encompasses forming the layer of metal rich transition or other metal compound and annealing that layer whilst or as soon as it is formed.

In that case, the forming of the layer of metal rich transition or other metal compound may be carried at the predetermined temperature and during the predetermined time.

In any case, the predetermined temperature may be between 300° C. and 600° C., in particular, between 350° C. and 500° C. and for example between 350° C. and 450° C.

In certain embodiments, the temperature of the chemical vapour deposition (for example, the atomic layer deposition) or physical vapour deposition (for example, the reactive sputtering) is below 300° C., and, in particular, below 250° C., and for example, below 200° C.

In embodiments, the annealing is carried out through a predetermined period of between 30 seconds and 60 minutes, preferably between 5 minutes and 40 minutes, and, most preferably, between 10 minutes and 30 minutes.

Note that the method is not particularly limited by the partial pressure of the gaseous precursor. The partial pressure of the gaseous precursor during the annealing may, for example, vary between 0.5 MPa and 1.5 MPa.

However, in some embodiments in which the layer of a metal rich transition or other metal oxide is annealed in the presence of carbon monoxide, a positive pressure of carbon dioxide may be used to minimise oxidation of carbon monoxide by oxygen.

An optimal electron back-donation in the correlated electron material may be determined by monitoring a peak area in the Fourier Transform Infra-Red (FT-IR) spectrum of the correlated electron material across a range of temperatures and a range of times for the annealing.

Alternatively, an optimal electron back-donation in the correlated electron material can be determined by monitoring a peak area in the C2s region of the X-ray photoelectron (XPS) spectrum of the correlated electron material across a range of temperatures and a range of times for the annealing.

In either case, the occurrence of a maximum signature peak area associated with a double bond between metal atom and a ligand atom such as carbon, viz. a >M=C< may be used to provide a predetermined temperature, and predetermined time for the method.

An optimal electron back-donation in the correlated electron material layer may correspond to at least 50%, in particular, at least 75% and, for example, at least 90% or even 100% of the % atom concentration (for example, % atom of carbon, nitrogen or phosphorus) characterising the amount of the electron back-donating extrinsic ligand in the correlated electron material layer.

An optimal electron back-donation in the correlated electron material may provide a higher electrical conductivity when the correlated electron material is operated in a relatively low impedance state.

Although the method may provide that the area size of the correlated electron material is between 4 $nm^2$ and 25 $\mu m^2$, an optimal electron back-donation may provide an area size of the correlated electron material which is less than 90 $nm^2$, for example, less than 50 $nm^2$, less than 30 $nm^2$ and, in particular, less than 20 $nm^2$ or less than 10 $nm^2$ or less than 5 $nm^2$.

In embodiments, the method may form the correlated electron material layer having a thickness between 1.5 nm and 150.0 nm, for example, between 1.5 nm and 50 nm.

The conductive substrate and/or the conductive overlay may comprise a transition metal or a conductive transition metal compound.

The method may, in particular, form the conductive substrate and/or the conductive overlay by a chemical vapour deposition (for example, an atomic layer deposition) or a physical vapour deposition (for example, by sputtering or by reactive sputtering).

In one embodiment, the method comprises forming the conductive substrate and/or the conductive overlay by an atomic layer deposition employing precursors having ligands "X" mentioned above together with a reducing agent such as hydrogen or triethylsilane, or an oxidising agent, such as water, oxygen or ozone.

In this embodiment, the method may form the conductive substrate and/or conductive overlay as a transition metal or a conductive transition metal oxide.

In another embodiment, the method may comprise forming the conductive substrate by sputtering or reactive sputtering. In this embodiment, the conductive substrate and/or conductive overlay may be formed as a conductive metal nitride or a conductive metal silicide.

The method may, in particular, form a conductive substrate and/or conductive overly comprising, for example, one or more of titanium nitride, tantalum nitride, platinum, titanium, copper, aluminium, cobalt nickel, tungsten, cobalt silicide, ruthenium, ruthenium oxide, chromium, gold, palladium, indium tin oxide, tantalum, silver, iridium, and iridium oxide.

Note that the method may form a sandwich structure for the device in which the correlated electron material layer is interposed between the conductive substrate and the conductive overlay. However, the method may form a structure only one of a conductive substrate or a conductive overlay are present with the correlated electron layer. In that case, the device may include source and drain regions for the correlated electron material layer.

In these embodiments, the method may form a conductive substrate and/or a conductive overlay having a thickness between 50 nm and 500 nm, for example, between 50 nm and 250 nm.

The present disclosure also provides a correlated electron material device comprising a conductive substrate and a layer of a correlated electron material wherein the correlated electron material layer is provided on the conductive substrate and wherein:

the layer of correlated electron material comprises a transition or other metal compound;

at least a proportion of anion vacancies within the transition or other metal compound are occupied by an electron back-donating extrinsic ligand for the transition or other metal cation; and at least a proportion of the electron back-donating extrinsic ligands occupying the anion vacancies are engaged by electron back-donation from the metal cation to the electron back-donating extrinsic ligand.

Note that the proportion of the electron back-donating extrinsic ligands occupying the anion vacancies which are engaged by electron back-donation from the metal cation to the electron back-donating extrinsic ligand may be predetermined.

This predetermined proportion may be brought about not only by a temperature and time employed for activation of electron back-donation from the metal cation to the electron back-donating extrinsic ligand but also through control over the number of anion vacancies within the transition or other metal compound when it is first formed and/or through control over the number of anion vacancies which are occupied by the electron back-donating extrinsic ligand.

Note here that the transition or other metal compound is not described as "metal rich" because of the occupation of the anion vacancies. It will be understood, however, that the transition or other metal compound is based on a "metal rich" transition or other metal compound.

In embodiments, the transition or other metal compound is based on a non-stoichiometric metal oxide having general formula $M_xO_{1-x}$ or $M_{1+x}O_2$ wherein M is alkaline earth metal, a lanthanide, a transition metal or a post-transition metal.

In other embodiments, the transition or other metal compound is based on a non-stoichiometric metal chalcogenide having general formula $M_xE_{1-x}$ or $M_{1+x}E_2$ and wherein M wherein M is alkaline earth metal, a lanthanide, a transition metal or a post-transition metal and E is one or more of sulphur (S), selenium (Se), tellurium (Te) and polonium (Po).

Note, however, that the transition or other metal compound may be based on a non-stoichiometric metal oxide or chalcogenide wherein the metal has an oxidation state greater than or equal to +3.

The alkaline earth metal may be chosen from the group consisting of magnesium, calcium, strontium or barium and mixtures thereof. The lanthanides may be chosen from the group consisting of lanthanum, cerium, praseodymium, neodymium, promethium, samarium, europium, gadolinium, terbium, dysprosium, erbium or ytterbium and mixtures thereof.

The transition metal may be chosen from the group of metals consisting of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold and mercury and mixtures thereof.

In particular embodiments, the transition metal is chosen from the group consisting of vanadium, chromium, manganese, iron, cobalt, nickel, niobium, molybdenum, technetium, ruthenium, rhodium, palladium, hafnium, tantalum, tungsten, rhenium, osmium, iridium and platinum and mixtures thereof. These transition metals are more electronegative than the remainder and consequently can back donate more electrons to the extrinsic ligand.

The post transition metal may be chosen from the group consisting of aluminum, gallium, indium, thallium, tin, lead, and bismuth and mixtures thereof.

In one embodiment, the transition or other metal compound is nickel (II) oxide (NiO) or hafnium (IV) oxide ($HfO_2$). In another embodiment, the transition metal or other compound is bismuth (III) telluride ($Bi_2Te_3$).

The transition or other metal oxide may be based on a transition or other metal oxide which is intrinsically a "p-type" transition or other metal oxide.

The electron back-donating extrinsic ligand may be chosen from the group of ligands consisting of the n-acceptors of the spectrochemical series of ligands. In particular embodiments, the extrinsic ligand is carbonyl (CO), nitrosyl (NO), an isocyanide (RNC where R is H, $C_1$-$C_6$ alkyl or $C_6$-$C_{10}$-aryl), an alkene (e.g. ethene), an alkyne (e.g. ethyne) or a phosphine such as a trialkyl phosphine or a triaryl phosphine ($R_3P$ wherein R is H, $C_1$-$C_6$-alkyl or $C_6$-$C_{10}$-aryl), for example, triethyl phosphine ($PEt_3$).

An optimal proportion of the electron back-donating extrinsic ligands which occupy the anion vacancies and are engaged by electron back-donation from the metal cation may correspond to at least 50%, in particular, at least 75% and, for example, at least 90% or even 100% of the % atom concentration (for example, % atom of carbon, nitrogen or phosphorus) characterising the amount of electron back-donating extrinsic ligand present in the correlated electron material.

Note that the optimal proportion may be determined by monitoring a peak area in the Fourier Transform Infra-Red (FT-IR) spectrum of the correlated electron material across a range of temperatures and a range of times for the annealing.

Alternatively, the optimal proportion may be determined by monitoring a peak area in the C1s region of the X-ray photoelectron (XPS) spectrum of the correlated electron material across a range of temperatures, and a range of times for the annealing.

In either case, the occurrence of a maximum signature peak area associated with a double bond or partial double bond between metal atom and a ligand atom such as carbon, viz. a >M=C< may be used to provide a predetermined temperature and predetermined time for the method.

As indicated above, an optimal electron back-donation in the correlated electron material may provide a higher electrical conductivity when the correlated electron material is operated in a relatively low impedance state.

In embodiments, therefore, the $V_{reset}$ and $V_{set}$ values shown in FIG. 1A may vary between about 0.1 V and 10.0 V subject to the condition that $V_{set} V_{reset}$. For example, in one embodiment, $V_{reset}$ may occur at a voltage approximately in the range of 0.1 V to 1.0 V, and $V_{set}$ may occur at a voltage approximately in the range of 1.0 V to 2.0 V.

Although the area size of the correlated electron material may be between 4 nm² and 25 µm², an optimal electron back-donation may provide that it is less than 90 nm², for example, less than 50 nm², less than 30 nm² and, in particular, less than 20 nm² or less than 10 nm² or less than 5 nm².

In embodiments, the % atom concentration of the electron back-donating extrinsic ligand (for example, carbon, nitrogen or phosphorus) in the correlated electron material may vary between about 0.1% and 15.0%, for example between about 0.1% and 10.0%.

The thickness of the correlated electron material layer may be between 1.5 nm and 100.0 nm, for example, between 1.5 nm and 50 nm.

In one embodiment, the correlated electron material device includes a conductive overlay. In this embodiment, the correlated electron material layer may be interposed between the conductive substrate and the conductive overlay.

In other embodiments, the correlated electron material device comprises only a conductive substrate and includes source and drain regions for the correlated electron material layer.

The conductive substrate and/or the conductive overlay may comprise a transition or other metal, or a transition or other metal compound, such as a transition or other metal oxide, nitride or silicide.

The conductive substrate and/or the conductive overlay may, in particular, comprise one or more of titanium nitride, tantalum nitride, platinum, titanium, copper, aluminium, cobalt nickel, tungsten, cobalt silicide, ruthenium, ruthenium oxide, chromium, gold, palladium, indium tin oxide, tantalum, silver, iridium, and iridium oxide.

In embodiments, the thickness of the conductive substrate and/or the conductive overlay may vary between 50 nm and 500 nm, for example, between 50 nm and 250 nm.

The method and correlated electron material (CEM) device according to the present disclosure will now be described in more detail having regard to the following non-limiting embodiments and the accompanying drawings in which.

Figure 4A:
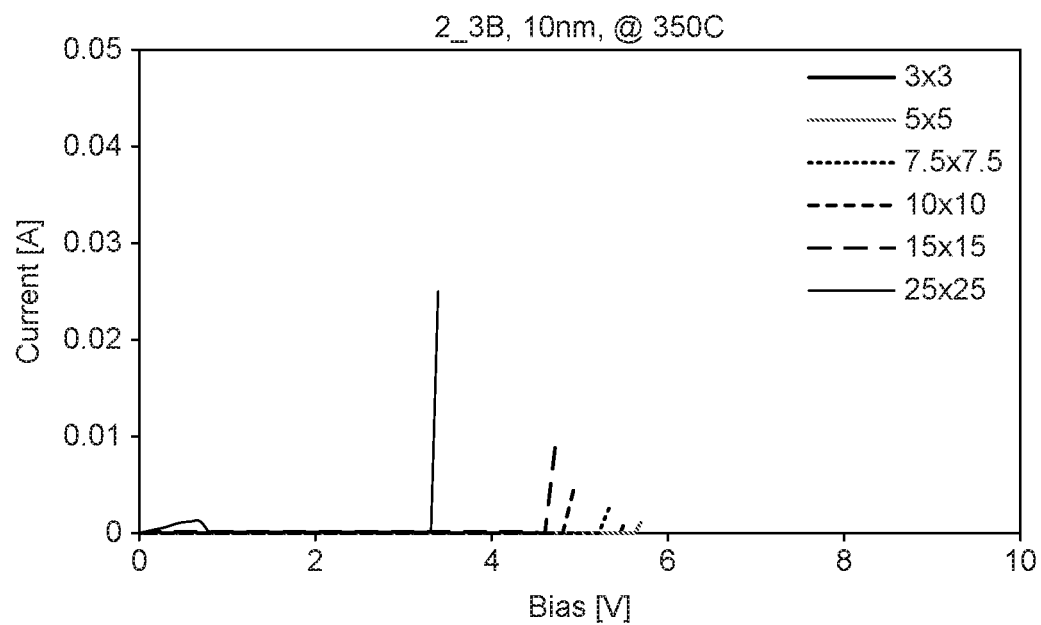
Figure 4B:
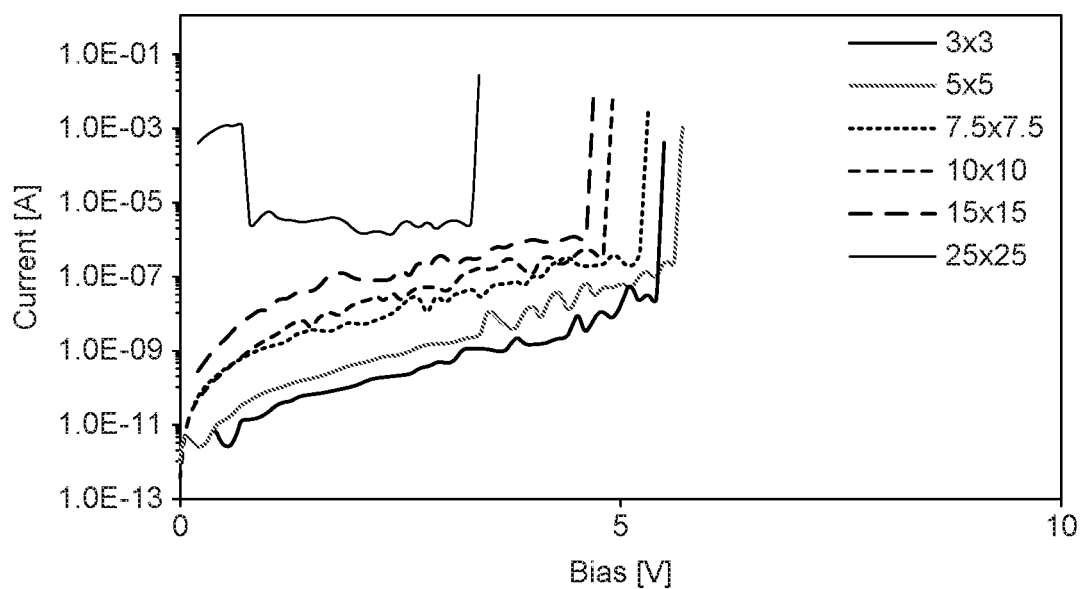
Figure 4C:
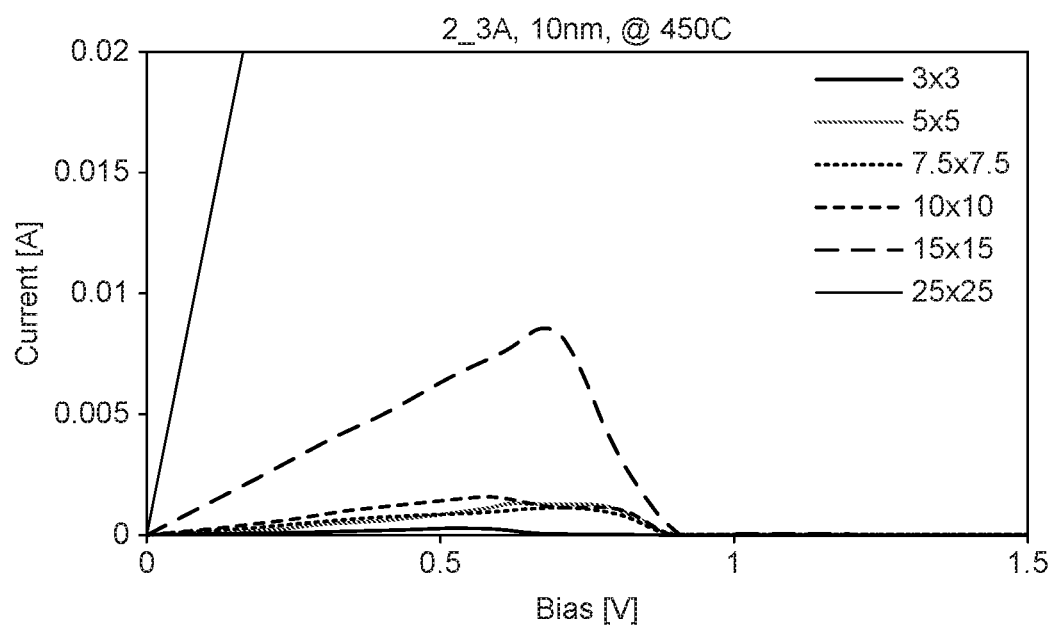
Figure 4D:
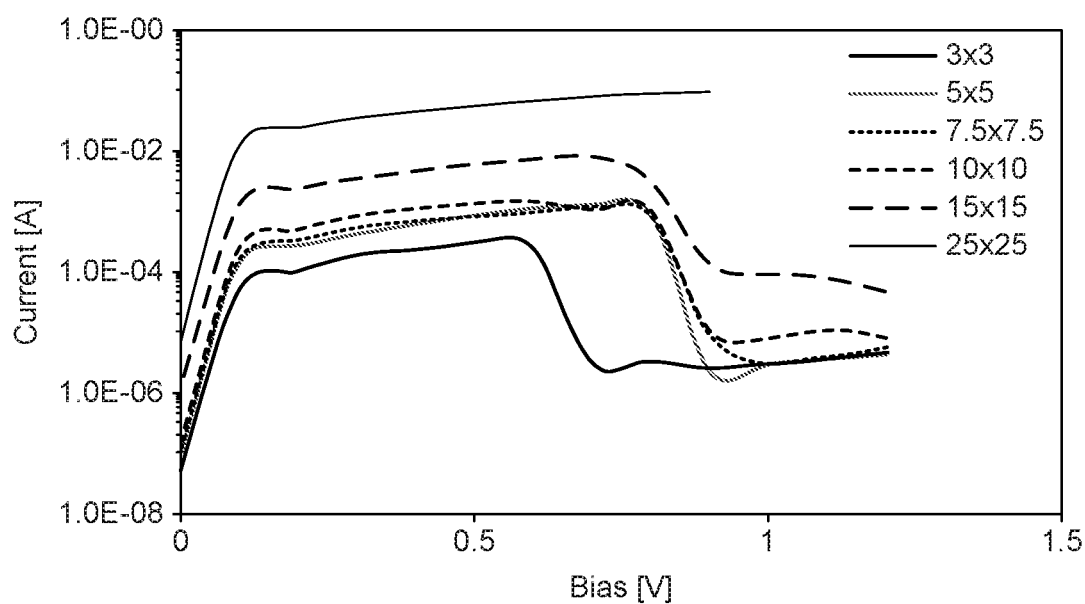
Figure 5:
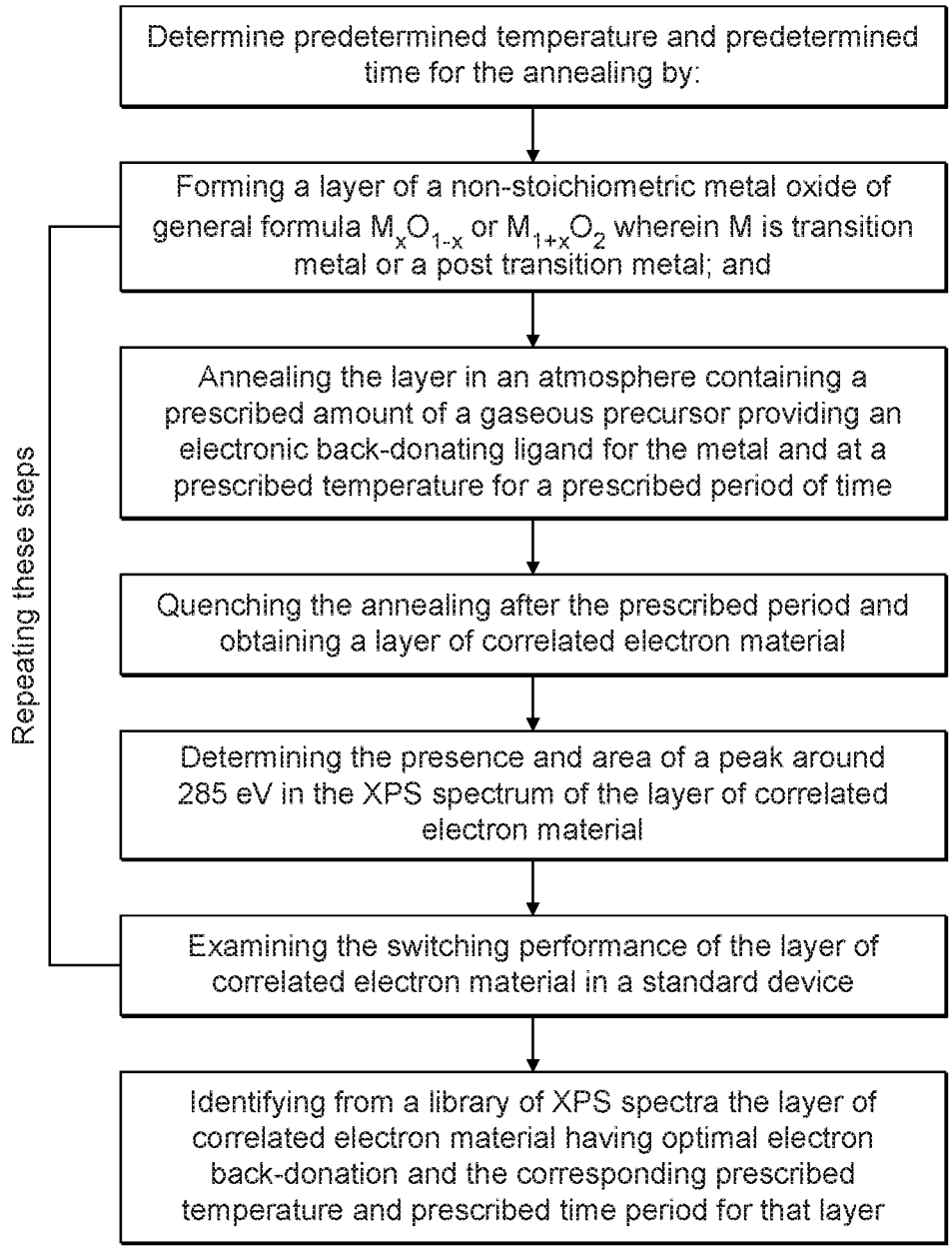

FIGS. 4A to 4B and 4C to 4D are respectively graphs that show the switching of the correlated electron material (hafnium dioxide, $HfO_2$) without activation of electron back donation (2-3B, FIGS. 4A and 4B) as compared with the switching of the correlated electron material (hafnium dioxide, $HfO_2$) with activation of electron back donation (2-3A. FIGS. 4C and 4D); and FIG. 5 is a scheme particularly pointing out the determination of the predetermined temperature and the predetermined time of the present disclosure.

Figure 1A:
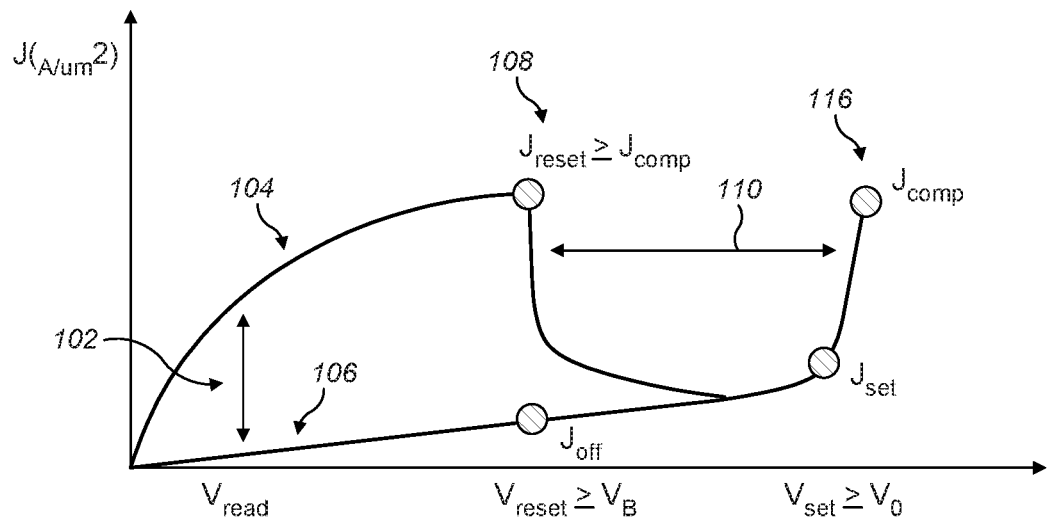
FIG. 1A shows a schematic illustration of a current density versus voltage profile of a CEM switching device.
Figure 1B:
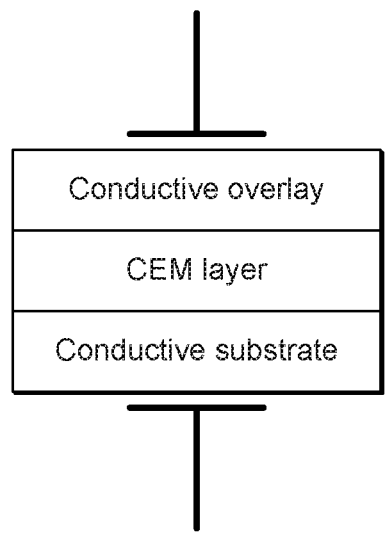
FIG. 1B shows a schematic illustration of the CEM switching device of FIG. 1A.
Figure 1C:
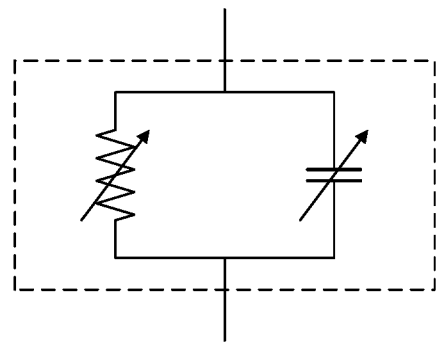
FIG. 1C shows a schematic diagram of an equivalent circuit for the switching device.
Figure 2:
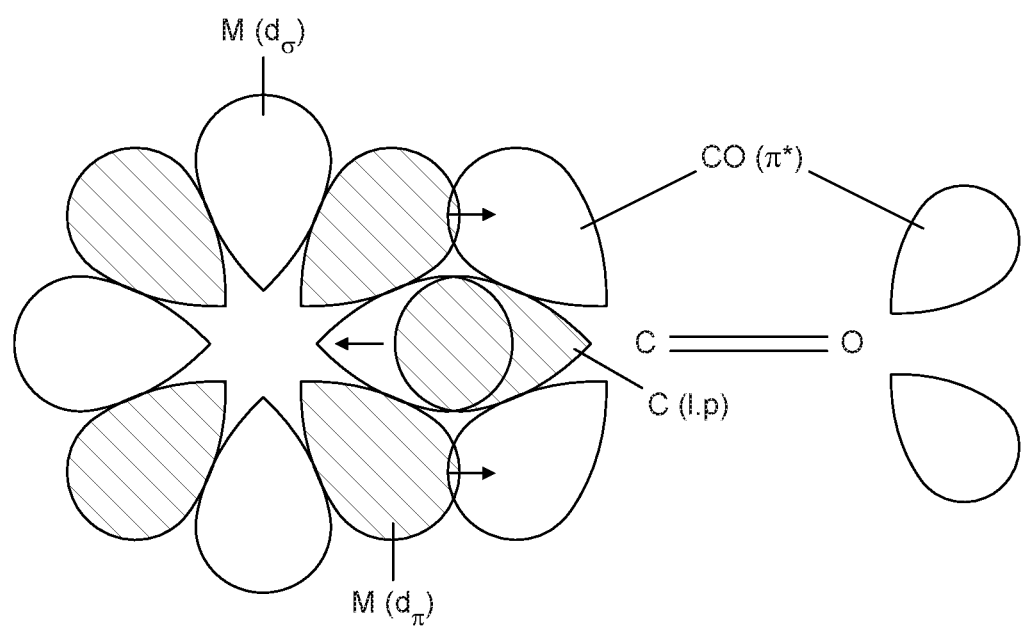
FIG. 2 is a schematic illustration showing the molecular bonding orbitals which are involved in an electron back donation between a transition metal atom and a carbonyl ligand.

Referring now to FIG. 2, there is shown a description of the bonding in metal carbonyls between a transition metal atom M and a carbonyl (CO) ligand.

This bonding is described in IUPAC Compendium of Chemical Technology, (Oxford 2006, $2^{nd}$ edition) as a synergic process with donation of electrons from a filled n-orbital (or lone electron pair orbital) of the ligand (here, labelled C(1.p)) into an empty $d_\sigma$ (here, unshaded) orbital of the metal M (see leftward arrow; the donor-acceptor bond) and release (see rightward arrow; back-donation) of electrons from a $d_\pi$-orbital (here, shaded) of the metal which has π-symmetry with respect to the metal-ligand axis into the empty π*-antibonding orbital (here labelled CO(π*)) of the ligand.

Whilst the above description reflects the bonding in metal carbonyls, such as $Ni(CO)_4$, which are liquid or gas in their natural state, it may not always reflect the bonding in the solid state and, in particular, the bonding in non-stoichiometric transition or other metal oxides or chalcogenides which are doped by carbonyl ligand.

As indicated above, the bonding may simply involve donation of electrons from a filled n-orbital (or lone electron pair orbital) of the ligand (here, labelled C(1.p)) into an empty $d_\sigma$ (here, unshaded) orbital of the metal M (see leftward arrow; the donor-acceptor bond).

The release (see rightward arrow; back-donation) of electrons from a $d_\pi$-orbital (here, shaded) of the metal which has π-symmetry with respect to the metal-ligand axis into the empty π*-antibonding orbital (here labelled CO(π*)) of the ligand appears to require activation by heating the transition or other metal oxide or chalcogenide to an appropriate temperature and during an appropriate time.

Figure 3A:
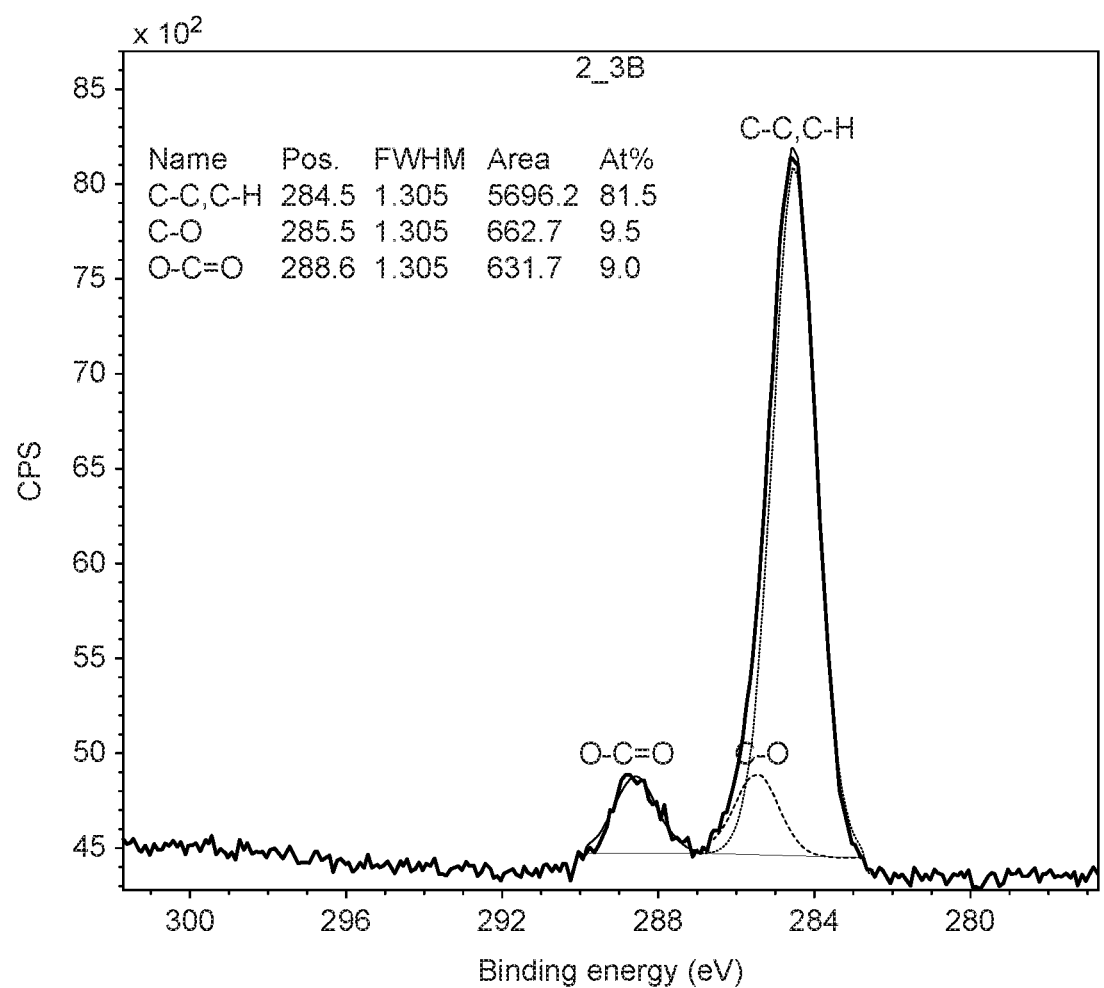
FIGS. 3A and 3B are respectively graphs obtained by X-ray photoelectron spectroscopy (XPS) of a correlated electron material (hafnium dioxide, $HfO_2$) without activation of electron back donation (2-3B) and a correlated electron material (hafnium dioxide, $HfO_2$) with activation of electron back donation (2-3A)
Figure 3B:
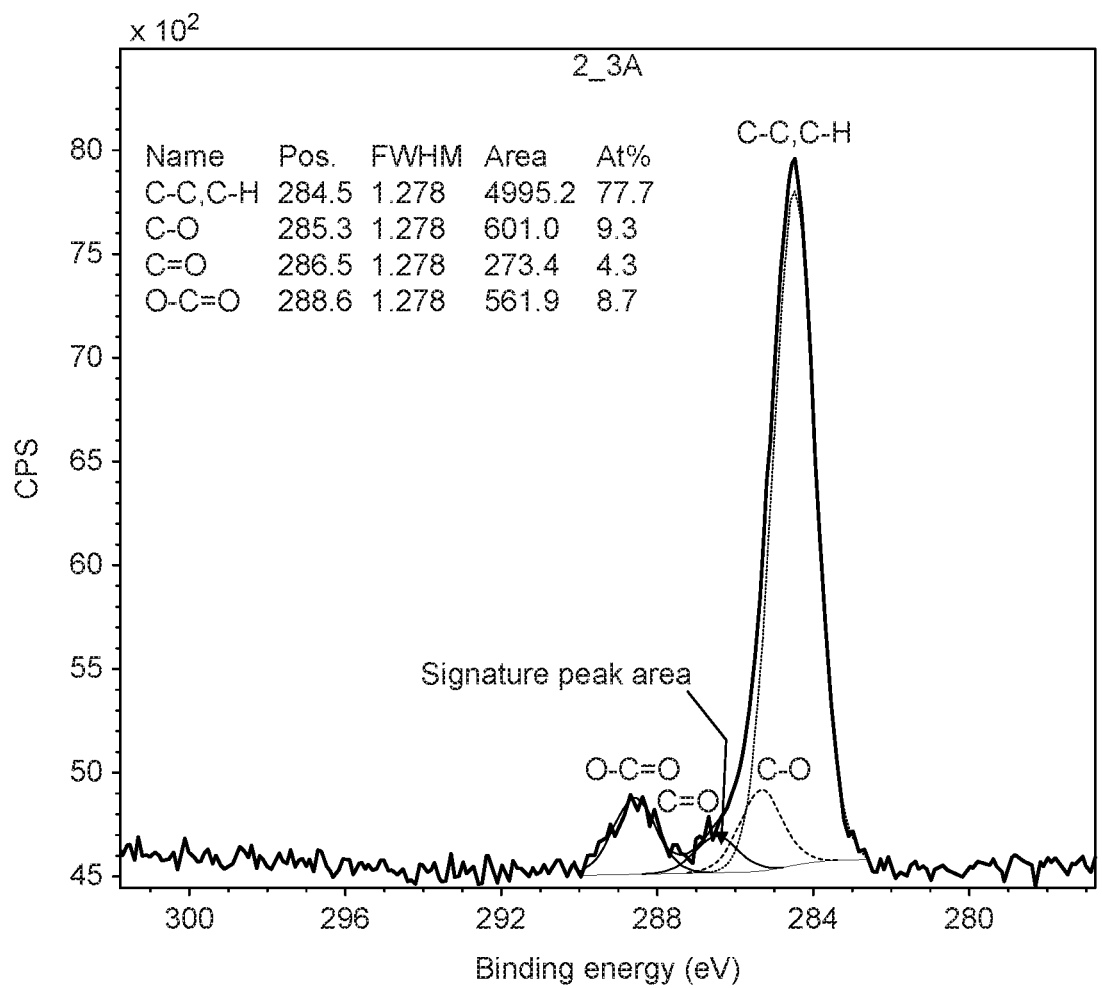

Referring now to FIG. 3, this requirement for activation of electron back-donation is seen in the comparison of the X-ray photoelectron spectroscopy spectra of layers of a correlated electron material (hafnium dioxide, $HfO_2$, 10 nm thickness) which were prepared by forming a layer of non-stoichiometric hafnium oxide and heated at different temperatures in the presence of carbon monoxide during a fixed period.

In particular, a first layer of non-stoichiometric hafnium oxide was prepared in exactly the same way as a second layer of the non-stoichiometric hafnium oxide.

The first layer of non-stoichiometric hafnium oxide was heated to a temperature of 350° C. for a fixed period (10 minutes) in the presence of a fixed quantity of carbon monoxide to produce a first layer of a correlated electron material (2-3B).

The second layer of non-stoichiometric hafnium oxide was heated to a temperature of 450° C. during the fixed period and in the presence of the fixed quantity of carbon monoxide to produce a second layer of a correlated electron material (2-3A).

X-ray photoelectron spectroscopy was carried out on each of the first and second layers of correlated electron material (2-3A and 2-3B) using a monochromatic Al $K_\alpha$ source (1486 eV) and charge correction to carbon 1s 284.8 eV.

The acceptance angle was +/−23° and the take-off angle 75°. The ion gun comprised $Ar^+$ at 1 keV and 3×3 raster. The analysis area was around 1400 µm by 300 µm. The analysis used Casa XPS software (version 2.3.14) and a standard Shirley background correction.

As may be seen, the X-ray photoelectron spectrum obtained on the first correlated electron material (2-3B) is absent a peak in the Cis envelope of the spectrum which is centred around 285 eV. The peak indicates the presence of carbon oxygen double bond (C=O) which can only arise in the second correlated electron material (2-3A) because of the change in the bonding between carbon atom and oxygen atom which results from electron back-donation from hafnium atom to carbon atom.

The electron back-donation provides that the hafnium atom to carbon atom single bond (Hf—C) becomes a hafnium atom to carbon atom double bond (Hf=C) and that the carbon atom to oxygen atom triple bond becomes a carbon atom to oxygen atom double bond (C=O).

The relationship between peak areas in this portion of the X-ray photoelectron spectrum can indicate the level of electron back-donation achieved across the carbonyl ligands which bond to hafnium in the correlated electron material.

Note that the table below the graphs indicates a % peak area for the peak centred around 285 eV having value 4.3. This value may represent a maximum or optimal value which corresponds with a particular or desired use (such as switching) for the correlated electron material device.

Note, however, that the correspondence also depends on the level of doping by carbonyl ligand in the correlated electron material and, in particular, the % atom concentration of carbon. Of course, the % peak area may indicate at an approximate level of doping by doping in the correlated electron material.

Referring now to FIG. 4, there are shown graphs reporting (part) current voltage profiles in correlated electron material devices in which a rectangular layer of correlated electron material is sandwiched between a conductive substrate and a conductive overlay.

The graphs relate to two sets of five devices wherein a first set comprises the first layer of correlated electron material (2-3B) and the surface area of that layer is between 3 nm by 3 nm and 25 nm by 25 nm and a second set comprises the second layer of correlated electron material (2-3A) and the surface area of that layer is between 3 nm by 3 nm and 25 nm by 25 nm.

As may be seen (most clearly, in the graphs in which the ordinate scale is logarithmic), all of the devices of the second set (except that in which the second layer of correlated electron material has surface area 25 nm×25 nm) are born on and exhibit switching to a relatively high impedance state at voltages below about 1.5 V or 1.0 V.

By contrast, all of the devices of the first set exhibit an initial relatively high impedance and no switching behavior. In other words, the graphs show that the second layer of correlated electron material is a "born on" correlated electron material and the first layer of correlated electron material is not a "born on" correlated electron material.

It appears, therefore, that electron back donation in the correlated electron material layer is needed for it to be a "born on" correlated electron material layer.

Referring now to FIG. 5, there is shown a method for determining the predetermined temperature and partial pressure for annealing a layer of a non-stoichiometric transition or other metal oxide and the duration of the annealing.

The determined data are subsequently used in the method providing for optimal electron back donation in the correlated electron material for a particular or desired use for the device.

As may be seen, the determination method begins by forming a layer of non-stoichiometric metal oxide of general formula $M_xO_{1-x}$ or $M_{1+x}O_2$ wherein M is a transition metal or a post-transition metal.

The layer of non-stoichiometric metal oxide is formed under carefully controlled process conditions which reproducibly prescribe an excess metal concentration and an oxygen vacancy population for the layer.

The method continues by annealing the layer of non-stoichiometric metal oxide in an atmosphere containing a prescribed amount of gaseous precursor providing an electron back-donating ligand for the metal at a prescribed temperature and for a prescribed time.

The annealing is quenched after the expiry of the prescribed period by rapid cooling in air or an inert atmosphere. After the quenching he correlated electron material layer that has formed from the annealing is examined by X-ray photoelectron spectroscopy.

The examination determines the presence and area of a peak characteristic in the carbon 2s envelope of the X-ray photoelectron spectrum at around 285 eV for electron back donation in the correlated electron material layer.

The method continues by examining the switching performance of a correlated electron material device of standard architecture comprising the layer of correlated electron material.

The foregoing steps are repeated through a repeating cycle in which only one or more of the prescribed temperature and the prescribed time are changed.

The method continues by identifying from the library of spectra obtained through the repeating cycle, the layer of correlated electron material having an optimal electron back-donation and the corresponding prescribed temperature and time at the prescribed partial pressure for forming the layer of correlated electron material.

The present disclosure provides a method which ensures that a correlated electron material is "born on" in the first formed correlated electron material device.

The present disclosure provides for design of correlated electron materials by controlling available electron back-donation within those materials. It may provide for higher electrical conductivity when the correlated electron material is operated in a relatively low impedance state.

The ability to increase the electrical conductivity of a correlated electron material layer when it is operated in a relatively low impedance state means that smaller surface areas, for example, rectangular surface areas approaching 5 nm×5 nm, may be used in the device.

Note that references herein to electron donation and electron back-donation and the like are references to donation and back-donation of electron density (or an overlap of electron molecular orbitals) between atoms.

Note also, that embodiments comprising transition or other metal compounds, such as transition or other metal chalcogenides, will be apparent from the description of embodiments comprising the transition or other metal oxides.

Note also that references herein to ranges include the beginning and end values.

The invention claimed is:

1. A method for manufacture of a correlated electron material device which method comprises forming a conductive substrate and forming a layer of a correlated electron material on the conductive substrate, wherein the forming of the layer of the correlated electron material comprises:

forming a layer of a metal rich transition or other metal compound, or combination thereof; and annealing the layer of the metal rich transition or other metal compound, or combination thereof, in a presence of a gaseous precursor for application of an electron back-donating extrinsic ligand capable of occupying an anion vacancy within the metal rich transition or other metal compound, or combination thereof;

wherein the annealing provides that an anion vacancy within the metal rich transition or other metal compound, or combination thereof, is occupied by the electron back-donating extrinsic ligand capable of occupying the anion vacancy; and wherein the annealing is carried out at an annealing temperature and for an annealing duration to activate an electron back-donation from a transition or other metal cation to the electron back-donating extrinsic ligand capable of occupying the anion vacancy.

2. The method according to claim 1, wherein the metal rich transition or other metal compound, or combination thereof comprises a non-stoichiometric metal oxide having general formula $M_xO_{1-x}$ or $M_{1+x}O_2$ wherein M comprises an alkaline earth metal, a lanthanide, a transition metal or a post-transition metal, or combination thereof.

3. The method according to claim 1, wherein the metal rich transition or other metal compound, or combination thereof, comprises a non-stoichiometric metal chalcogenide having general formula $M_xE_{1-x}$ or $M_{1+x}E_2$, and wherein M wherein M comprises an alkaline earth metal, a lanthanide, a transition metal or a post-transition metal, or combination thereof, and E comprises sulphur (S), selenium (Se), tellurium (Te) or polonium (Po), or combination thereof.

4. The method according to claim 1, wherein the metal rich transition or other metal compound, or combination thereof, comprises nickel (II) oxide (NiO), hafnium (IV) oxide ($HfO_2$) or bismuth (III) telluride ($Bi_2Te_3$) or combination thereof.

5. The method according to claim 1, wherein the annealing temperature is between 300° C. and 600° C.

6. The method according to claim 1, wherein the annealing duration is between 30 seconds and 60 minutes.

7. The method according to claim 1, wherein the gaseous precursor is maintained at a partial pressure of between 0.5 MPa and 1.5 MPa during at least a portion of the annealing.

8. The method according to claim 1, further comprising forming a conductive overlay on or over the correlated electron material layer.

9. The method according to claim 1, wherein the forming of the correlated electron material layer provides an area size for the correlated electron material which is less than 90 $nm^2$.

10. The method according to claim 1, wherein the annealing activates the electron back-donation from the transition or other metal cation to an amount of the applied extrinsic ligand present in the correlated electron material layer of at least fifty percent.

11. The method of claim 1, wherein the annealing temperature is between 350° C. and 500° C.

12. The method of claim 1, wherein the annealing temperature is between 350° C. and 450° C.

13. The method according to claim 1, wherein the electron back-donating extrinsic ligand comprises carbonyl (CO), nitrosyl (NO), an isocyanide (RNC where R is H, $C_1$-$C_6$ alkyl or $C_6$-$C_{10}$-aryl), an alkene, an alkyne or a phosphine, or combination thereof.

14. The method of claim 13, wherein the phosphine comprises a trialkyl phosphine, a triaryl phosphine ($R_3P$ wherein R is H, $C_1$-$C_6$-alkyl or $C_6$-$C_{10}$-aryl) or a triethyl phosphine ($PEt_3$), or a combination thereof.

15. The method according to claim 1, wherein the electron back-donation from the transition or other metal cation to the electron back-donating extrinsic ligand corresponds to a maximum in a signature peak area associated with a double bond between a metal atom and a ligand atom in a spectrum of the correlated electron material.

16. The method of claim 15, wherein the spectrum of the correlated electron material comprises a Fourier Transform Infra-Red (FT-IR) spectrum of the correlated electron material.

17. The method of claim 15, wherein the spectrum of the correlated electron material comprises an X-ray photoelectron emission (XPS) spectrum of the correlated electron material.

* * * * *